United States Patent
Nakamura et al.

(10) Patent No.: US 10,063,029 B2
(45) Date of Patent: Aug. 28, 2018

(54) OPTICAL TRANSMISSION MODULE

(71) Applicant: Oclaro Japan, Inc., Sagamihara, Kanagawa (JP)

(72) Inventors: Atsushi Nakamura, Nagano (JP);
Nozomu Yasuhara, Kanagawa (JP);
Shunya Yamauchi, Kanagawa (JP);
Yoriyoshi Yamaguchi, Kanagawa (JP);
Yoshihiro Nakai, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/443,000

(22) Filed: Feb. 27, 2017

(65) Prior Publication Data

US 2017/0250521 A1    Aug. 31, 2017

(30) Foreign Application Priority Data

Feb. 29, 2016   (JP) .................................. 2016-036722

(51) Int. Cl.
*H01S 5/0683* (2006.01)
*H01S 5/026* (2006.01)
(Continued)

(52) U.S. Cl.
CPC .......... *H01S 5/06832* (2013.01); *H01S 5/026* (2013.01); *H01S 5/028* (2013.01); *H01S 5/0425* (2013.01); *H01S 5/06817* (2013.01)

(58) Field of Classification Search
CPC ........ H01S 5/0265; H01S 5/1014; H01S 5/12; H01S 5/1203; H01S 5/026; H01S 5/1064; H01S 5/50
See application file for complete search history.

(56) References Cited

U.S. PATENT DOCUMENTS 5,285,468 A * 2/1994 Ackerman ................ H01S 5/12
372/49.01
7,463,663 B2 * 12/2008 Fukamachi ............ B82Y 20/00
372/43.01
(Continued)

FOREIGN PATENT DOCUMENTS

JP    09-289354 A    11/1997
JP    2003-037337 A    2/2003

OTHER PUBLICATIONS

Ryoichi Ito, et al., "Semiconductor Laser[Basics and Applications]", Baifukan, 1989, pp. 147-159. (partial translation).

*Primary Examiner* — Michael Carter
(74) *Attorney, Agent, or Firm* — Mattingly & Malur, PC

(57) ABSTRACT

Provided is an optical transmission module in which noise is further reduced. The optical transmission module includes a first semiconductor layer having a first electrode arranged thereon, an active layer with a stripe shape formed on the first semiconductor layer, and a second semiconductor layer with a stripe shape formed on the active layer. The second semiconductor layer has a second electrode arranged thereon and includes a diffraction grating arranged along an extending direction of the active layer. The active layer includes a first portion having first stripe width, a second portion having a second stripe width smaller than the first stripe width, and a connection portion having a varying stripe width so as to connect the first portion and the second portion to each other. The diffraction grating overlaps with the first portion and does not overlap with the second portion in planar view.

8 Claims, 11 Drawing Sheets

(51) Int. Cl.
*H01S 5/028* (2006.01)
*H01S 5/042* (2006.01)
*H01S 5/068* (2006.01)

(56) References Cited

U.S. PATENT DOCUMENTS

| | | | |
|---|---|---|---|
| 8,463,086 B2* | 6/2013 | Shoji | H01S 5/0265 |
| | | | 372/26 |
| 8,855,156 B2* | 10/2014 | Koeth | H01S 5/1228 |
| | | | 372/45.01 |
| 2002/0003825 A1* | 1/2002 | Granestrand | H01S 5/0265 |
| | | | 372/50.1 |
| 2002/0172248 A1* | 11/2002 | Kito | H01S 5/227 |
| | | | 372/46.01 |
| 2022/0172248 | 11/2002 | Kito | |
| 2012/0236394 A1* | 9/2012 | Hayakawa | H01L 21/02463 |
| | | | 359/328 |

* cited by examiner

OPTICAL TRANSMISSION MODULE

CROSS-REFERENCE TO RELATED APPLICATION

The present application claims priority from Japanese application JP 2016-036722, filed on Feb. 29, 2016, the content of which is hereby incorporated by reference into this application.

BACKGROUND OF THE INVENTION

1. Field of the Invention

The present invention relates to an optical transmission module.

2. Description of the Related Art

As a modulation for an optical signal used in optical communication, pulse amplitude modulation (PAM) may be employed. PAM is a modulation in which signal coding is performed based on difference of optical intensity.

In JP 2003-037337 A, there is disclosed a semiconductor laser in which the width of each stripe varies in a tapered form and side surfaces sandwiching the stripes are inclined with respect to a main surface of a substrate.

Further, in JPH09-289354A, there is disclosed a semiconductor laser element in which the stripe width continuously increases from a rear end surface toward a front end surface.

Further, in Ryoichi Ito and Michiharu Nakamura (co-edited), Semiconductor Laser [Basics and Applications], Baifukan, 1989, a relaxation oscillation frequency and a modulation degree of a semiconductor laser are described.

SUMMARY OF THE INVENTION

In recent years, a multi-level PAM with a larger number of levels than 2 (binary PAM) is used in some cases in order to achieve a larger data traffic volume. In the multi-level PAM using the larger number of levels than 2, a difference between signal intensities may be smaller than that in the binary PAM. Therefore, the multi-level PAM with the larger number of levels than 2 may be more susceptible to noise than the binary PAM.

Therefore, the present invention has an object to provide an optical transmission module in which noise is further reduced.

(1) In order to solve the above-mentioned problem, according to one embodiment of the present invention, there is provided an optical transmission module, including: a first semiconductor layer having a first electrode arranged thereon; an active layer formed on the first semiconductor layer so as to have a stripe shape; a second semiconductor layer, which includes a diffraction grating arranged along an extending direction of the active layer; and a second electrode arranged on the second semiconductor layer. The second semiconductor layer is formed on the active layer so as to have a stripe shape. The active layer includes: a first portion, which extends from one end surface and has a first stripe width; a second portion, which extends from a side opposite to the one end surface and has a second stripe width that is smaller than the first stripe width; and a connection portion, which has a varying stripe width so as to connect the first portion and the second portion to each other. The diffraction grating overlaps with the first portion and does not overlap with the second portion in planar view.

(2) The optical transmission module according to Item (1) further includes: a reflection film arranged on the one end surface; and an anti-reflection film arranged on an end surface on the side opposite to the one end surface.

(3) The optical transmission module according to Item (1) further includes an optical modulator, which is optically connected to the second portion of the active layer, and is configured to modulate an amplitude of light emitted from the second portion.

(4) In the optical transmission module according to Item (1), the active layer is integrally formed as a multiple quantum well.

(5) In the optical transmission module according to Item (1), the second electrode includes: a laser electrode arranged above the first portion; and an optical waveguide electrode arranged above the second portion separately from the laser electrode.

(6) In the optical transmission module according to Item (1), the second electrode is integrally formed above the first portion, the second portion, and the connection portion.

(7) The optical transmission module according to Item (1) further includes a protective wall, which is arranged along the second portion and on at least one of both sides of the second portion.

(8) In the optical transmission module according to Item (1), the active layer is curved at the second portion in planar view.

According to the present invention, the optical transmission module in which noise is further reduced is provided.

DETAILED DESCRIPTION OF THE INVENTION

First Embodiment

Figure 1:
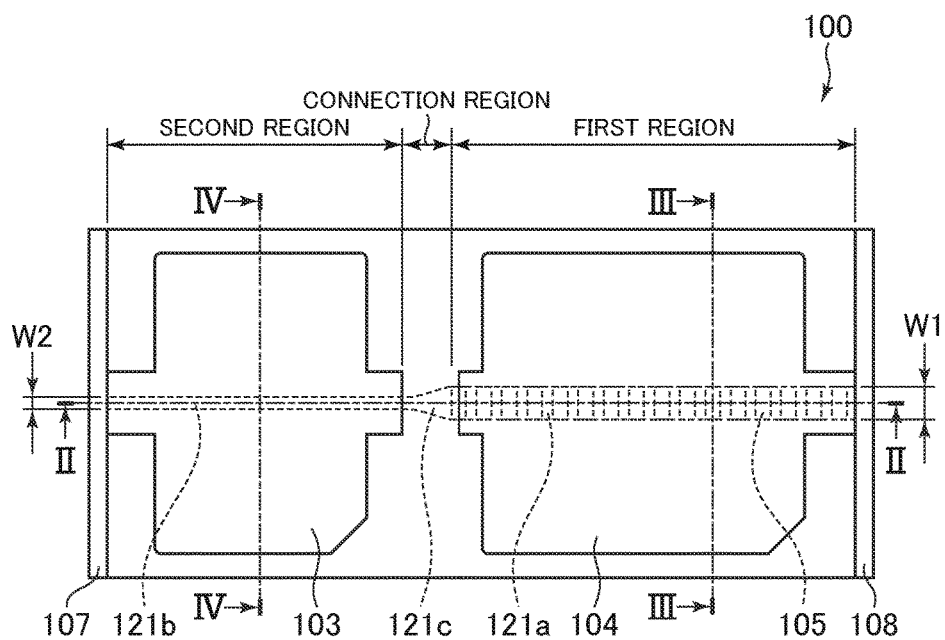
FIG. 1 is a top view of a first optical transmission module according to a first embodiment of the present invention.

Now, embodiments of the present invention are specifically described in detail with reference to the attached drawings. Throughout the figures for illustrating the embodiments, like reference numerals are used to represent members having like functions, and description thereof is omitted for the sake of simplicity. The drawings referred to in the following are only for illustrating the embodiments by way of examples, and are not necessarily drawn to scale.

Figure 2:
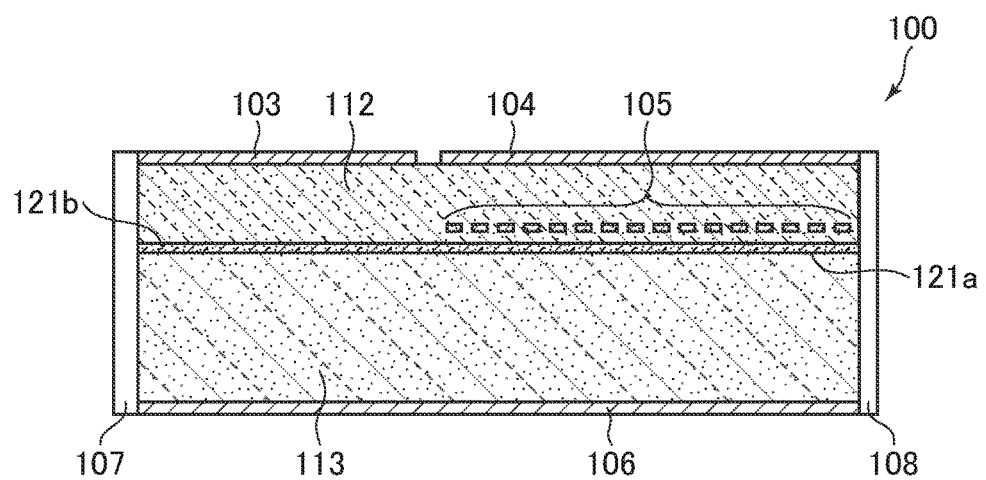
FIG. 2 is a cross sectional view of the first optical transmission module according to the first embodiment of the present invention taken along the line II-II of FIG. 1.

FIG. 1 is a top view of a first optical transmission module 100 according to a first embodiment of the present invention. Further, FIG. 2 is a view for illustrating a cross section of the optical transmission module 100 according to the first embodiment of the present invention taken along the line II-II of FIG. 1. The first optical transmission module 100 includes an n-type InP layer 113 provided with an n-type electrode 106. The n-type electrode 106 serves as a first electrode and the n-type InP layer 113 serves as a first semiconductor layer.

The first optical transmission module 100 includes, on the n-type InP layer 113, an active layer 121 having a stripe shape. The first optical transmission module 100 further includes a p-type InP layer 112, which includes a diffraction grating 105 arranged along an extending direction of the active layer 121, an optical waveguide electrode 103, and a laser electrode 104. The p-type InP layer 112 is formed on the active layer 121 and has a stripe shape. The optical waveguide electrode 103 and the laser electrode 104 serve as a second electrode, and the p-type InP layer 112 serves as a second semiconductor layer.

The active layer 121 includes a first portion 121a, which extends from one end surface and has a first stripe width W1. With the first stripe width W1, the first portion 121a extends from an end surface opposite to a light emitting end surface of the first optical transmission module 100. The first portion 121a is a portion of the active layer 121 that is arranged in a first region illustrated in FIG. 1, and laser oscillation is performed by applying a voltage to the laser electrode 104 arranged above the first portion 121a. The first stripe width W1 may be several micrometers, for example.

The active layer 121 includes a second portion 121b, which extends from aside opposite to the one end surface and has a second stripe width W2 that is smaller than the first stripe width W1. With the second stripe width W2, the second portion 121b extends from the light emitting end surface of the first optical transmission module 100. The second portion 121b is a portion of the active layer 121 that is arranged in a second region illustrated in FIG. 1, and is configured to amplify laser light emitted from the first portion 121a, based on a voltage applied to the optical waveguide electrode 103 arranged above the second portion 121b. The second stripe width W2 may be around one third of the first stripe width W1, and may be several hundred nanometers, for example.

The active layer 121 includes a connection portion 121c in which the stripe width varies, to thereby connect the first portion 121a and the second portion 121b to each other. In planar view, the connection portion 121c has a tapered shape in which its stripe width changes from the first stripe width W1 to the second stripe width W2. The connection portion 121c is a portion of the active layer 121 that is arranged in a connection region illustrated in FIG. 1. One or both of the laser electrode 104 and the optical waveguide electrode 103 may be arranged so as to overlap with the connection portion 121c in planar view.

The diffraction grating 105 overlaps with the first portion 121a and does not overlap with the second portion 121b in planar view. The diffraction grating 105 is arranged above the first portion 121a of the active layer 121, and is configured to reflect light having a particular wavelength (or a waveband) to the extending direction of the active layer 121. The diffraction grating 105 may be arranged so as to overlap with the connection portion 121c in planar view, or may be arranged so as not to overlap with the laser electrode 104 in planar view.

Figure 3:
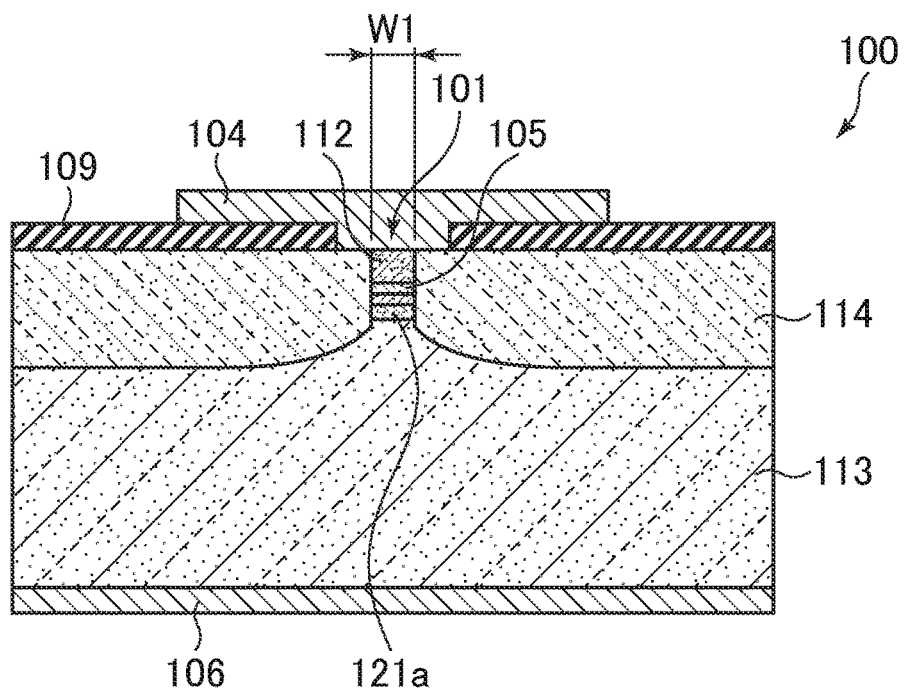
FIG. 3 is a cross sectional view of the first optical transmission module according to the first embodiment of the present invention taken along the line of FIG. 1.

FIG. 3 is a view for illustrating a cross section of the optical transmission module 100 according to the first embodiment of the present invention taken along the line III-III of FIG. 1. The n-type InP layer 113 provided with the n-type electrode 106 has a mountain shaped cross section, and the active layer 121 is formed on a top portion thereof so as to have a stripe shape. The p-type InP layer 112 is formed above the active layer 121 so as to have a stripe shape. In FIG. 3, the first portion 121a of the active layer 121 formed so as to have the first stripe width W1, and the diffraction grating 105 formed above the first portion 121a are illustrated. A high-resistance InP layer 114 is arranged on each side of a ridge portion, which is formed of the active layer 121 and the p-type InP layer 112 and has the first stripe width W1. The high-resistance InP layer 114 is an buried layer arranged on the p-type InP layer 112. An insulating layer 109 is arranged on the high-resistance InP layer 114. The insulating layer 109 is not arranged on the p-type InP layer 112. The laser electrode 104 is arranged on the p-type InP layer 112. When the laser electrode 104 is applied with a laser drive voltage, a current constricted at the p-type InP layer 112 flows to the first portion 121a of the active layer 121 to generate photons. This is combined with reflection by the diffraction grating 105, thereby causing laser oscillation.

Figure 4:
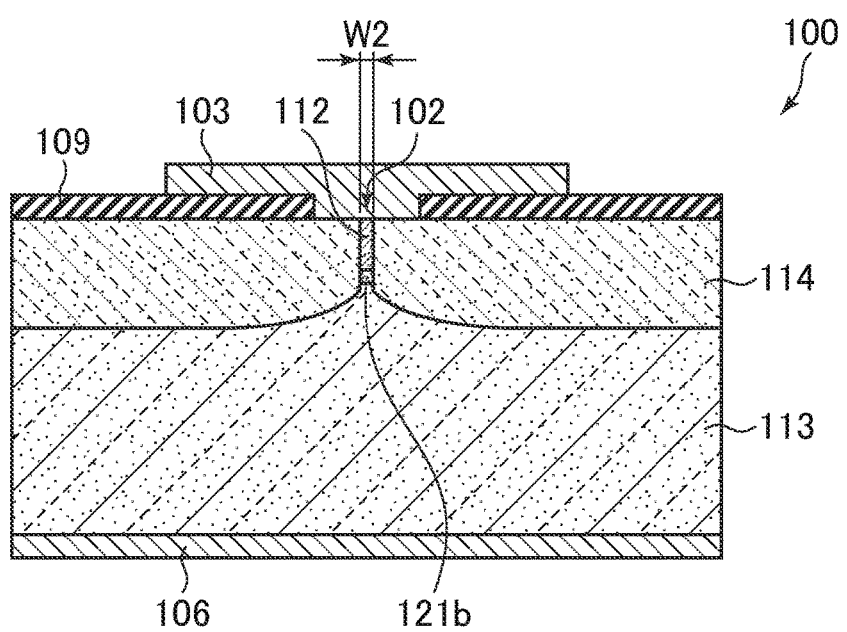
FIG. 4 is a cross sectional view of the first optical transmission module according to the first embodiment of the present invention taken along the line IV-IV of FIG. 1.

FIG. 4 is a view for illustrating a cross section of the optical transmission module 100 according to the first embodiment of the present invention taken along the line IV-IV of FIG. 1. In FIG. 4, the second portion 121b of the active layer 121 formed so as to have the second stripe width W2 is illustrated. The diffraction grating 105 is not formed above the second portion 121b of the active layer 121. The high-resistance InP layer 114 is arranged on both sides of the ridge portion, which is formed of the active layer 121 and the p-type InP layer 112 and has the second stripe width W2. The insulating layer 109 is arranged on the high-resistance InP layer 114. The insulating layer 109 is not formed on the p-type InP layer 112. The optical waveguide electrode 103 is arranged on the p-type InP layer 112. When the optical waveguide electrode 103 is applied with a voltage, a current constricted at the p-type InP layer 112 flows to the second portion 121b of the active layer 121 to cause stimulated emission, thereby amplifying the laser light emitted from the first portion 121a.

In the second portion 121b, the laser light emitted from the first portion 121a is amplified, and hence a photon density at the second portion 121b becomes higher as compared to that at the first portion 121a. Further, because the photon density at the second portion 121b is higher than the photon density at the first portion 121a, a carrier consumption amount per unit volume due to stimulated emission at the second portion 121b becomes larger than a carrier consumption amount per unit volume due to stimulated emission at the first portion 121a. As a result, a carrier density at the second portion 121b becomes lower than a carrier density at the first portion 121a.

Noise in a PAM signal generated by the first optical transmission module 100 is due to light that is generated through spontaneous emission. This is because fluctuation in light intensity occurs when the laser light generated through stimulated emission is combined with the light generated through spontaneous emission. A relative intensity noise (RIN) is known as an index for quantifying such fluctuation (noise). An RIN becomes smaller when there is less spontaneous emission light. In the first optical transmission module 100 according to this embodiment, the second portion 121b is arranged on an emitting side of the active layer 121 and the second stripe width W2 is made narrower than the first stripe width W1, and thus the carrier density of the second portion 121b becomes lower than the carrier density of the first portion 121a. When the carrier density becomes lower, carriers contributing to spontaneous emission decrease, and hence an RIN is reduced. Therefore, according to the first optical transmission module 100 of this embodiment, noise is reduced.

When the stripe width of the active layer 121 is uniformly narrowed, for example, when the stripe width of the active layer 121 is uniformly set to the second stripe width W2 in the extending direction, the carrier density at the first region is relatively raised. As a result, it becomes difficult to reduce the total amount of carriers, and hence the effect of reducing an RIN becomes smaller.

According to the first optical transmission module 100 of this embodiment, the noise generated at the first portion 121a may also be reduced. According to "Ryoichi Ito and Michiharu Nakamura" given above, a relaxation oscillation frequency $f_r$ of the semiconductor laser is expressed by Expression (1).

$$f_r = \frac{1}{2\pi}\left(\frac{S_0}{\tau_p}\left(\frac{\partial g_t}{\partial n}\right)_{n=n_0}\right)^{\frac{1}{2}}$$

where $S_0$ represents a DC component of the photon density, $\tau_p$ represents a photon lifetime, $g_t$ represents a gain coefficient, n represents a carrier density, and $n=n_0$ represents the DC component of the carrier number.

Further, according to "Ryoichi Ito and Michiharu Nakamura," a modulation degree $M(\omega)=|S(\omega)/S(0)|$ of the semiconductor laser at a modulation degree frequency $\omega$ is represented by Expression (2), where $S(\omega)$ represents a modulation component of the photon density at the modulation degree frequency $\omega$.

$$M(\omega) = \frac{\omega_r^2}{((\omega^2 - \omega_r^2)^2 + \omega^2\Omega^2)^{\frac{1}{2}}}$$

where $\omega_r=2\pi f_r$, $\Omega$ represents an amount given by $\Omega=1/\tau_s + \tau_p\omega_r^2$, and $\tau_s$ represents a carrier lifetime.

When approximation is performed as $\Omega \approx \tau_p\omega_r^2$, the modulation degree $M(\omega)$ is approximated as $M(\Omega) \approx (\tau_p S_0 (\partial g_t/\partial n)_{n=n0})^{-1/2}$. Further, under a steady state in which the photon density does not change, $1/\tau_p = \Gamma(n-n_0)(\partial g_t/\partial n)_{n=n0}$ is satisfied, where $\Gamma$ represents an optical confinement rate. Therefore, a modulation degree $M(\omega_r)$ at the relaxation angular frequency $\omega_r$ is represented by Expression (3).

$$M(\omega_r) \simeq \sqrt{\frac{(n-n_0)}{S_0/\Gamma}}$$

According to Expression (3), the modulation degree $M(\omega_r)$ at the relaxation angular frequency $\omega_r$ may be decreased by reducing the carrier density n, by reducing the optical confinement rate $\Gamma$, or by increasing the DC component $S_0$ of the photon density. Decreasing of the modulation degree means that even when fluctuation due to the spontaneous emission light occurs in the stimulated emission light, an influence thereof is small, thereby resulting in the reduction of RIN.

Expressions (1) to (3) relate to the semiconductor laser. However, by defining $1/\tau_p$ as a difference between the number of emitted photons per unit time and the number of entering photons per unit time, Expressions (1) to (3) may be applied to an optical waveguide.

In the first optical transmission module 100 according to this embodiment, the second stripe width W2 is narrower than the first stripe width W1. Therefore, the optical confinement rate $\Gamma$ at the second portion 121b of the active layer 121 becomes smaller, and the modulation degree at the second portion 121b becomes smaller. As a result, an RIN is reduced. Further, as described above, the carrier density at the second portion 121b becomes smaller than the carrier density at the first portion 121a. Thus, the modulation degree at the second portion 121b becomes smaller, thereby reducing the RIN. The optical confinement rate $\Gamma$ at the second portion 121b is relatively small, and hence an optical amplification factor per unit length at the second portion 121b is reduced. As a result, the photon lifetime is lengthened, the relaxation oscillation frequency $f_r$ is reduced, and a modulation bandwidth is decreased. Therefore, the spontaneous emission light generated at the first portion 121a is attenuated at the second portion 121b.

As illustrated in FIG. 1 and FIG. 2, the first optical transmission module 100 according to this embodiment includes a reflection film 108 arranged on one end surface, and an anti-reflection film 107 formed on an end surface opposite to the one end surface. Now, in this embodiment, the "one end surface" is an end surface of the first portion 121a of the active layer 121 that has a relatively large stripe width, and is a surface for reflecting the laser light. Further, in this embodiment, the "end surface opposite to the one end surface" is an end surface of the second portion 121b of the active layer 121 that has a relatively small stripe width, and is an emitting surface for the laser light.

According to the first optical transmission module 100 of this embodiment, because the first optical transmission module 100 includes the reflection film 108, stimulated emission is enhanced at the first portion 121a of the active layer 121, and laser light having a stronger light intensity is emitted. Further, because the first optical transmission module 100 includes the anti-reflection film 107, the light entering the emitting surface is prevented from entering the active layer 121, and the oscillation of the laser light is prevented.

As illustrated in FIG. 1 and FIG. 2, the optical waveguide electrode 103 and the laser electrode 104 (second electrode) of the first optical transmission module 100 according to this embodiment are formed separately from each other. In planar view, the optical waveguide electrode 103 and the laser electrode 104 are disconnected from each other in the connection region, and may be applied with different voltages. Then-type electrode 106, which is the first electrode, is a common electrode that is integrally formed.

According to the first optical transmission module 100 of this embodiment, by forming the optical waveguide electrode 103 and the laser electrode 104 separately, a current density at the first portion 121a of the active layer 121 and a current density at the second portion 121b of the active layer 121 may be regulated independently, and a voltage may be selected so as to reduce the noise of the laser light. Thus, the noise may be further reduced.

The active layer 121 of the first optical transmission module 100 according to this embodiment is integrally formed as a multiple quantum well. The active layer 121 includes the first portion 121a having the first stripe width W1, the second portion 121b having the second stripe width W2, and the connection portion 121c, which has a varying stripe width so as to connect the first portion 121a and the second portion 121b to each other. The active layer 121 according to this embodiment is formed on the n-type InP layer 113 as the multiple quantum well, and then molded to have a stripe shape through etching.

According to the first optical transmission module 100 of this embodiment, because the active layer 121 is integrally formed as the multiple quantum well, a threshold current may be reduced and high-power laser light may be emitted.

Second Embodiment

Figure 5:
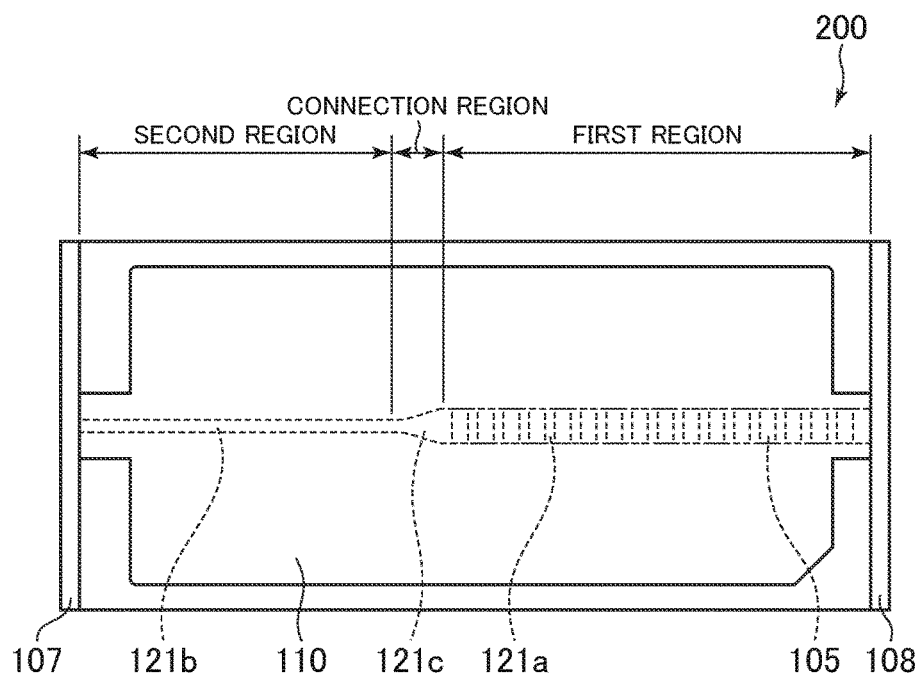
FIG. 5 is a top view of a second optical transmission module according to a second embodiment of the present invention.

FIG. 5 is a top view of a second optical transmission module 200 according to a second embodiment of the present invention. The second optical transmission module 200 according to this embodiment is different from the first optical transmission module 100 in that a p-type electrode 110, which is the second electrode, is integrally arranged above the first portion 121a, the second portion 121b, and the connection portion 121c of the active layer 121. Other configurations of the second optical transmission module 200 according to this embodiment are the same as those of the first optical transmission module 100 according to the first embodiment.

According to the second optical transmission module 200 of the second embodiment of the present invention, due to the p-type electrode 110 that is integrally formed, the first portion 121a and the second portion 121b of the active layer 121 are each supplied with a current having a common current density. Further, the laser light is amplified at the second portion 121b, and hence the photon density at the second portion 121b becomes higher than the photon density at the first portion 121a. Therefore, the carrier density at the second portion 121b becomes smaller than the carrier density at the first portion 121a, to thereby reduce an RIN.

Third Embodiment

Figure 6:
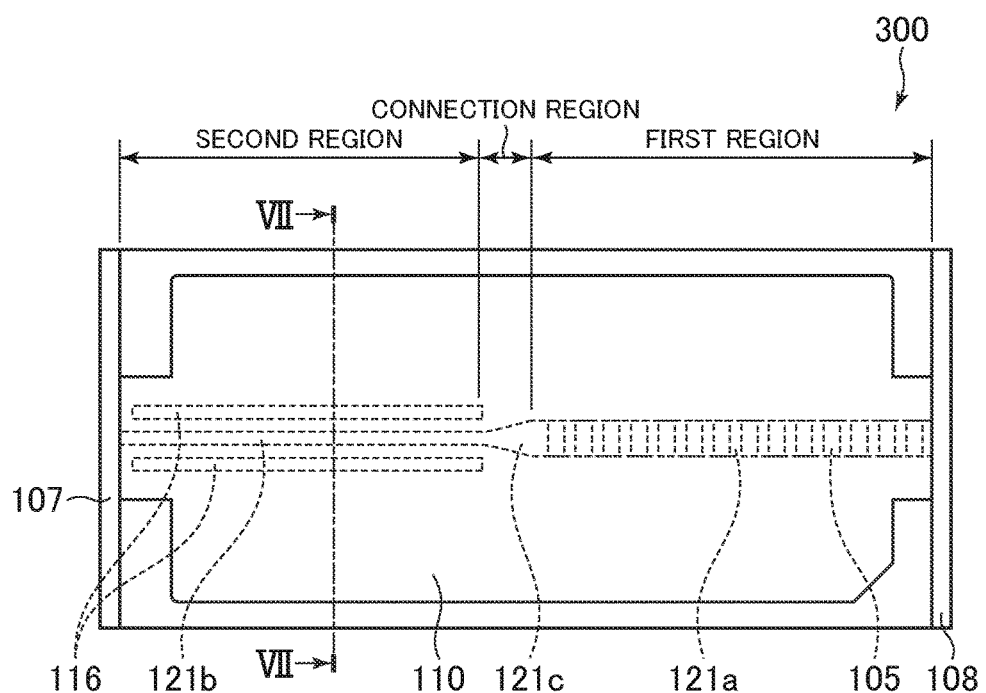
FIG. 6 is a top view of a third optical transmission module according to a third embodiment of the present invention.

FIG. 6 is a top view of a third optical transmission module 300 according to a third embodiment of the present invention. The third optical transmission module 300 according to this embodiment is different from the first optical transmission module 100 according to the first embodiment in that the third optical transmission module 300 has a protective wall 116, which is formed along the second portion 121b of the active layer 121 and on at least one side of both sides of the second portion 121b. In particular, the third optical transmission module 300 according to this embodiment has two protective walls 116 on both sides of the second portion 121b. The two protective walls 116 each have a stripe width that is about the same as that of the second portion 121b, and extend in parallel with the extending direction of the second portion 121b. Further, the third optical transmission module 300 according to this embodiment is different from the first optical transmission module 100 according to the first embodiment in that the p-type electrode 110, which is the second electrode, is integrally formed above the first portion 121a, the second portion 121b, and the connection portion 121c of the active layer 121. Other configurations of the third optical transmission module 300 according to this embodiment are the same as those of the first optical transmission module 100 according to the first embodiment. The third optical transmission module 300 according to this embodiment has, on both sides of the second portion 121b, the two protective walls 116, which each have a stripe width that is about the same as that of the second portion 121b, and extend in parallel with the extending direction of the second portion 121b. However, the protective wall 116 may be formed on only one side of the second portion 121b, and the stripe width of the protective wall 116 may be different from the stripe width of the second portion 121b.

Figure 7:
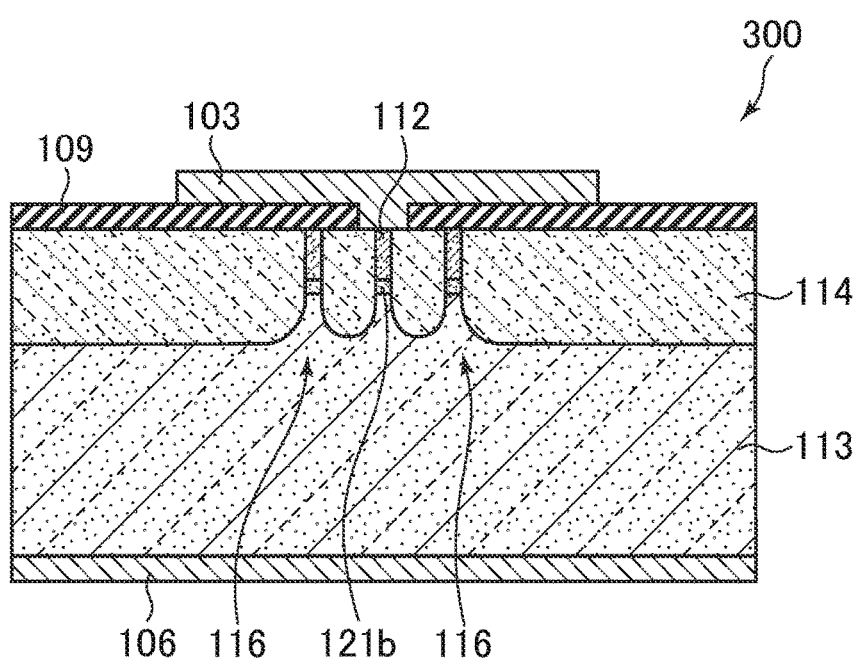
FIG. 7 is a cross sectional view of the third optical transmission module according to the third embodiment of the present invention taken along the line VII-VII of FIG. 1.

FIG. 7 is a view for illustrating a cross section of the third optical transmission module 300 according to the third embodiment of the present invention taken along the line VII-VII of FIG. 6. The protective wall 116 has the laminated structure that is the same as the ridge portion including the second portion 121b of the active layer 121. That is, the n-type InP layer 113 of the third optical transmission module 300 according to this embodiment is molded into a mountain shape having three peaks. A layer made of the same material as the active layer 121 and a layer made of the same material as the p-type InP layer 112 are laminated above each of the three peaks of the n-type InP layer 113. In this case, the insulating film 109 is formed on the layer, which is made of the same material as the p-type InP layer 112 and forms the two protective walls 116, and thus the layer made of the same material as the p-type InP layer 112 is electrically insulated from the optical waveguide electrode 103. The optical waveguide electrode 103 is electrically connected to the p-type InP layer 112 through the ridge portion in the middle (including the second portion 121b of the active layer 121).

According to the third optical transmission module 300 of this embodiment, because the third optical transmission module 300 has the protective wall 116, which is formed along the second portion 121b of the active layer 121 and on at least one side of both sides of the second portion 121b, the ridge portion including the second portion 121b is prevented from breaking when the ridge portion is formed. When the ridge portion including the second portion 121b is formed to have a stripe width of several hundred nanometers through wet etching, there is a fear that a force may be applied to the ridge portion through vibration of an etchant, to thereby break the ridge portion. By forming the protective wall 116, the vibration of the etchant around the ridge portion is suppressed, and the ridge portion is prevented from breaking.

Fourth Embodiment

Figure 8:
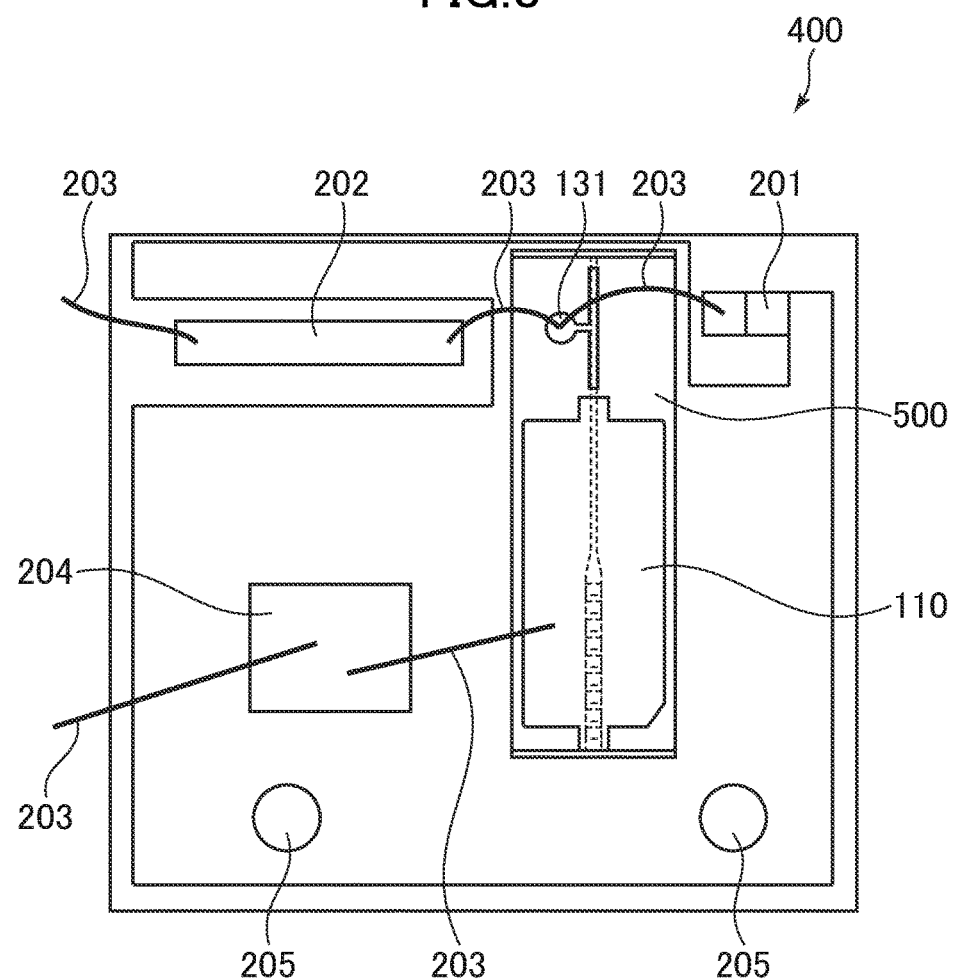
FIG. 8 is a top view of an optical transmitter chip according to a fourth embodiment of the present invention.

FIG. 8 is a top view of an optical transmitter chip 400 according to a fourth embodiment of the present invention. The optical transmitter chip 400 includes a first modulator-integrated optical transmission module 500, a chip capacitor 204, a high-frequency line 202, a terminating resistor 201, and via holes 205.

Figure 9:
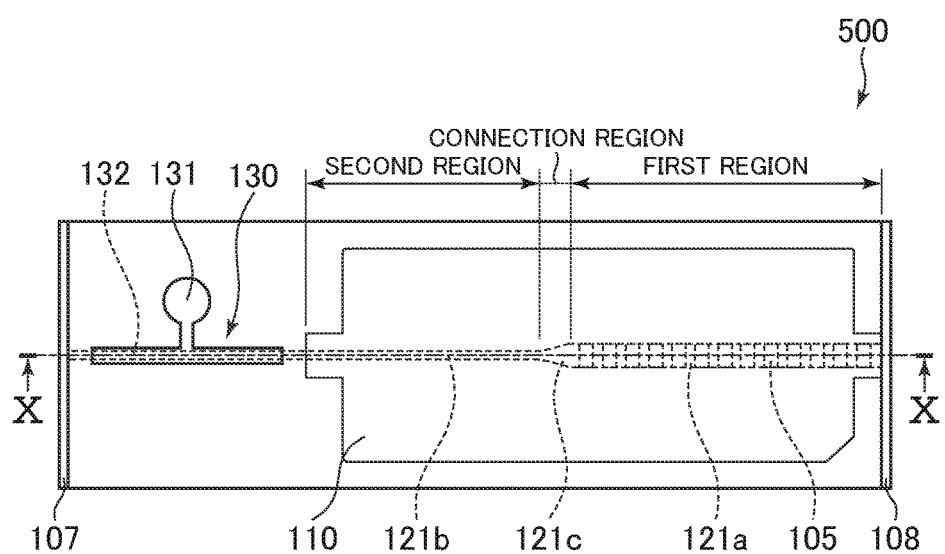
FIG. 9 is a top view of a first modulator-integrated optical transmission module to be mounted on the optical transmitter chip according to the fourth embodiment of the present invention.

FIG. 9 is a top view of the first modulator-integrated optical transmission module 500 to be mounted on the optical transmitter chip 400 according to the fourth embodiment of the present invention. The first modulator-integrated optical transmission module 500 according to this embodiment is different from the first optical transmission module 100 according to the first embodiment in that the first modulator-integrated optical transmission module 500 includes an electro-absorption optical modulator 130, which is optically connected to the second portion 121b of the active layer 121, and is configured to modulate an amplitude of light emitted from the second portion 121b. The first modulator-integrated optical transmission module 500 according to this embodiment includes, on a light-emitting side of the second portion 121b, a modulator waveguide 132 having a stripe width that is about the same as that of the second portion 121b. Based on a voltage applied to an optical modulator electrode 131, the electro-absorption optical modulator 130 absorbs the laser light passing through the modulator waveguide 132, to thereby modulate the intensity of the laser light. Further, the first modulator-integrated optical transmission module 500 according to this embodiment is different from the first optical transmission module 100 according to the first embodiment in that the p-type electrode 110, which is the second electrode, is integrally arranged above the first portion 121a, the second portion 121b, and the connection portion 121c of the active layer 121. Other configurations of the first modulator-integrated optical transmission module 500 according to this embodiment are the same as those of the first optical transmission module 100 according to the first embodiment. In the first modulator-integrated optical transmission module 500 according to this embodiment, the anti-reflection film 107 is arranged on an emission end surface of the electro-absorption optical modulator 130.

The high-frequency line 202 arranged on the optical transmitter chip 400 has both ends thereof connected to wires 203, and is configured to transmit a high-frequency signal to the optical modulator electrode 131 included in the first modulator-integrated optical transmission module 500. The optical modulator electrode 131 is connected to the terminating resistor 201 through the wire 203, and the high-frequency signal is terminated at the terminating resistor 201. Through this configuration, the high-frequency signal (modulation signal) is applied to the electro-absorption optical modulator 130, and the intensity of the laser light is modulated.

The chip capacitor 204 is connected to the wires 203, and is configured to supply the laser drive voltage to the p-type electrode 110 included in the first modulator-integrated optical transmission module 500. Further, the via holes 205 are connected to a ground electrode arranged on a rear surface of the optical transmitter chip 400, and are for supplying a ground potential to the n-type electrode 106 included in the first modulator-integrated optical transmission module 500.

Figure 10:
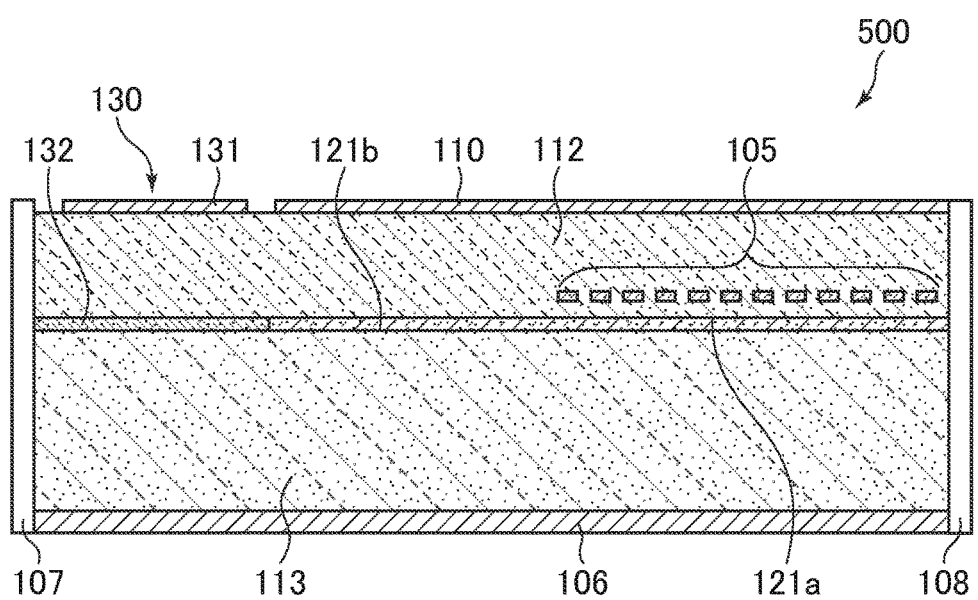
FIG. 10 is a cross sectional view of the first modulator-integrated optical transmission module to be mounted on the optical transmitter chip according to the fourth embodiment of the present invention taken along the line X-X of FIG. 9.

FIG. 10 is a cross sectional view of the first modulator-integrated optical transmission module 500 to be mounted on the optical transmitter chip 400 according to the fourth embodiment of the present invention taken along of the line X-X of FIG. 9. The first modulator-integrated optical transmission module 500 includes the p-type electrode 110 integrally arranged above the first portion 121a, the second portion 121b, and the connection portion 121c of the active layer 121, and the electro-absorption optical modulator 130 arranged above the modulator waveguide 132 and separately from the p-type electrode 110. The active layer 121 and the modulator waveguide 132 may be formed using the same materials. Further, the active layer 121 and the modulator waveguide 132 may be integrally formed as the multiple quantum well.

According to the first modulator-integrated optical transmission module 500 of this embodiment, because the first modulator-integrated optical transmission module 500 includes the second portion 121b of the active layer 121 having a relatively narrow stripe width and has the electro-absorption optical modulator 130 mounted thereon, the multi-level PAM signal with less noise may be output. Further, according to the optical transmitter chip 400 of this embodiment, because the optical transmitter chip 400 has the first modulator-integrated optical transmission module 500 mounted thereon and the first modulator-integrated optical transmission module 500 has the electro-absorption optical modulator 130 integrated therein, there is obtained the optical transmitter chip, which is small in size and may output the multi-level PAM signal with less noise.

Fifth Embodiment

Figure 11:
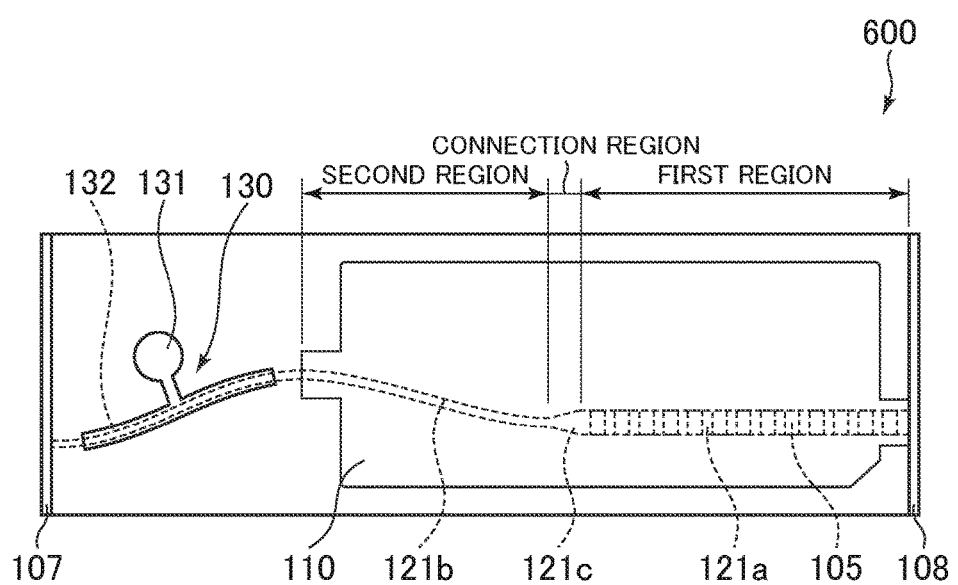
FIG. 11 is a top view of a second modulator-integrated optical transmission module according to a fifth embodiment of the present invention.

FIG. 11 is a top view of a second modulator-integrated optical transmission module 600 according to a fifth embodiment of the present invention. The second modulator-integrated optical transmission module 600 according to this embodiment is different from the first optical transmission module 100 according to the first embodiment in that the active layer 121 of the second modulator-integrated optical transmission module 600 is curved at the second portion 121b in planar view. Further, the second modulator-integrated optical transmission module 600 is different from the first optical transmission module 100 according to the first embodiment in that the second modulator-integrated optical transmission module 600 includes the electro-absorption optical modulator 130, which is optically connected to the second portion 121b of the active layer 121, and is configured to modulate the amplitude of the light emitted from the second portion 121b. The second modulator-integrated optical transmission module 600 according to this embodiment is different from the first modulator-integrated optical transmission module 500 according to the fourth embodiment in that the modulator waveguide 132 is curved in planar view. Further, the second modulator-integrated optical transmission module 600 according to this embodiment is different from the first optical transmission module 100 according to the first embodiment in that the p-type electrode 110, which is the second electrode, is integrally arranged above the first portion 121a, the second portion 121b, and the connection portion 121c of the active layer 121. Other configurations of the second modulator-integrated optical transmission module 600 according to this embodiment are the same as those of the first optical transmission module 100 according to the first embodiment. In the second modulator-integrated optical transmission module 600 according to this embodiment, the anti-reflection film 107 is arranged on the emitting end surface of the electro-absorption optical modulator 130.

In the second modulator-integrated optical transmission module 600 according to this embodiment, the active layer 121 has the following configuration. That is, the first portion 121a, which is arranged in the first region, is arranged to be linear and have a certain stripe width, the connection portion 121c, which is arranged in the connection region, is arranged to be tapered and have a varying stripe width, and the second portion 121b, which is arranged in the second region, is arranged to be curved and have a certain stripe width. In this case, the stripe width of the second portion 121b is narrower than the stripe width of the first portion 121a. Further, the modulator waveguide 132 has the same stripe width as the second portion 121b, and is arranged to be curved.

According to the second modulator-integrated optical transmission module 600 of this embodiment, because the second portion 121b is arranged to be curved in planar view, even when the ridge portion including the second portion 121b is formed to have a stripe width of several hundred nanometers through wet etching, the force from the ridge portion side due to the vibration of the etchant around the ridge portion is dispersed, and hence the ridge portion is prevented from breaking. Further, because the modulator waveguide 132 is arranged to be curved in planar view, the electro-absorption optical modulator 130 is prevented from breaking.

The embodiments of the present invention are not limited to those described above. For example, the second stripe width W2, which is the stripe width of the second portion 121b of the active layer 121, is not limited to be around one third of the first stripe width W1, which is the stripe width of the first portion 121a, as long as the relationship of W1>W2 is satisfied. Further, the length of the connection portion 121c of the active layer 121 (length measured along the emitting direction of the laser light) is shorter than the length of the first portion 121a and the length of the second portion 121b, but the length of the first portion 121a and the length of the second portion 121b may have any magnitude relationship. In addition, the diffraction grating 105 does not overlap with the second portion 121b in planar view, but may overlap with the connection portion 121c as long as the diffraction grating 105 overlaps with a part of the first portion 121a.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmission module, comprising:
    a first semiconductor layer having a first electrode arranged thereon;
    an active layer formed on the first semiconductor layer and having a stripe shape;
    a second semiconductor layer, which comprises a diffraction grating arranged along an extending direction of the active layer, the second semiconductor layer formed on the active layer and having a stripe shape; and
    a second electrode arranged on the second semiconductor layer,
    wherein the active layer comprises:
        a first portion which extends from one end surface and has a first stripe width;
        a second portion which extends from a side opposite to the one end surface and has a second stripe width that is smaller than the first stripe width; and
        a connection portion which has a varying stripe width so as to connect the first portion and the second portion to each other,
    wherein the diffraction grating overlaps with the first portion and does not overlap with the second portion in planar view,
    wherein the second electrode overlaps with the first portion and the second portion in planar view,
    wherein the optical transmission module further comprises an optical modulator, which is optically connected to the second portion of the active layer, and is configured to modulate an amplitude of light emitted from the second portion, and
    wherein the first portion, the second portion, and the connection portion in the active layer are made of a common material.

2. The optical transmission module according to claim 1, further comprising:
    a reflection film arranged on the one end surface; and
    an anti-reflection film arranged on an end surface on the side opposite to the one end surface.

3. The optical transmission module according to claim 1, wherein the first portion, the second portion and the connecting portion of the active layer are integrally formed as a multiple quantum well.

4. The optical transmission module according to claim 1, wherein the second electrode comprises:
    a laser electrode arranged above the first portion; and
    an optical waveguide electrode arranged above the second portion separately from the laser electrode.

5. The optical transmission module according to claim 1, wherein the second electrode is integrally formed above the first portion, the second portion, and the connection portion.

6. The optical transmission module according to claim 1, further comprising a protective wall which is arranged along the second portion and on at least one of both sides of the second portion.

7. The optical transmission module according to claim 1, wherein the active layer is curved at the second portion in planar view.

8. The optical transmission module according to claim 1, wherein the optical modulator comprises a third electrode which is electrically separated from the second electrode.

* * * * *